United States Patent [19]

Cambou et al.

[11] Patent Number: 5,512,499
[45] Date of Patent: Apr. 30, 1996

[54] METHOD OF MAKING SYMMETRICAL AND ASYMMETRICAL MESFETS

[75] Inventors: Bertrand F. Cambou, Mesa; James G. Gilbert, Chandler; Gregory L. Hansell, Tempe, all of Ariz.

[73] Assignee: Motorola, Inc., Schaumburgh, Ill.

[21] Appl. No.: 32,760

[22] Filed: Mar. 15, 1993

Related U.S. Application Data

[63] Continuation of Ser. No. 662,653, Mar. 1, 1991, abandoned.

[51] Int. Cl.$^6$ ............................................. H01L 21/265
[52] U.S. Cl. ............................................ 437/39; 437/912
[58] Field of Search ............................ 437/40, 41, 44, 437/45, 175, 912, 39, 184; 148/DIG. 139, DIG. 140; 257/190, 192, 194, 280, 281, 282, 283, 284, 200, 472

[56] References Cited

U.S. PATENT DOCUMENTS

| | | | |
|---|---|---|---|
| 4,542,577 | 9/1985 | Jackson | 357/22 I |
| 4,559,693 | 12/1985 | Kamei | 357/22 I |
| 4,636,822 | 1/1987 | Codella et al. | 357/22 I |
| 4,729,966 | 3/1988 | Kashino et al. | 357/22 I |
| 4,769,339 | 9/1988 | Ishii | 437/41 |
| 4,792,531 | 12/1988 | Kakihana | 357/22 I |
| 4,847,212 | 7/1989 | Balzan et al. | 437/41 |
| 4,855,246 | 8/1989 | Codella et al. | 437/44 |
| 4,902,635 | 2/1990 | Imamura et al. | 437/44 |
| 4,956,308 | 9/1990 | Griffis et al. | 437/41 |
| 4,962,054 | 10/1990 | Shikata | 437/45 |
| 4,992,387 | 2/1991 | Tamura | 437/44 |
| 5,001,077 | 3/1991 | Sakai | 437/44 |
| 5,036,017 | 7/1991 | Noda | 437/912 |
| 5,043,294 | 8/1991 | Willer et al. | 437/44 |

FOREIGN PATENT DOCUMENTS

| | | | |
|---|---|---|---|
| 0392120 | 10/1990 | European Pat. Off. . | |
| 0120471 | 5/1988 | Japan | 357/22 I |
| 0107071 | 5/1988 | Japan | 437/44 |
| 63-107071 | 5/1988 | Japan | 437/44 |
| 0182866 | 7/1988 | Japan . | |
| 0273362 | 10/1988 | Japan . | |
| 0302574 | 12/1988 | Japan . | |
| 0251670 | 10/1989 | Japan . | |
| 0040924 | 2/1990 | Japan | 437/44 |
| 0134828 | 5/1990 | Japan | 437/912 |
| 0048429 | 3/1991 | Japan . | |

OTHER PUBLICATIONS

"Submicron–Gate Self–Aligned Gallium Arsenide FET Fabrication", IBM Technical Disclosure Bulletin, vol. 28, No. 6, Nov. 1985, pp. 2687–2690.

Primary Examiner—George Fourson
Assistant Examiner—Brian K. Dutton
Attorney, Agent, or Firm—Miriam Jackson

[57] ABSTRACT

A method of fabricating a MESFET is comprised of providing a semiconductor material having a channel region formed therein, forming a gate on the semiconductor material over the channel region, forming a spacer adjacent a first portion of the gate disposed on the semiconductor material, and forming a hard mask disposed on a second portion of the gate and on a portion of the semiconductor material.

7 Claims, 3 Drawing Sheets

5,512,499

METHOD OF MAKING SYMMETRICAL AND ASYMMETRICAL MESFETS

This application is a continuation of prior application Ser. No. 07/662,653, filed Mar. 1, 1991, now abandoned.

BACKGROUND OF THE INVENTION

This invention relates, in general, to a method of making field effect transistors, and more particularly, to a method of making symmetrical and asymmetrical Metal Semiconductor Field Effect Transistors (MESFETs) High Electron Mobility Transistors (HEMTs).

In the past, MESFETs have been fabricated symmetrically having highly doped $N^+$ source/drain regions on either side of a self-aligned gate electrode. This structure has several disadvantages due to its symmetry. First, the close proximity of one of the $N^+$ regions, the drain, to the gate electrode causes a large reduction in the gate-drain breakdown voltage. A high gate-drain breakdown voltage is required for power MESFETs because a low gate-drain breakdown voltage will severely limit the power handling capability of the MESFET. In the past asymmetrical devices have been built utilizing very complex processing. It would be desirable to come up with a very manufacturable and low-cost process to fabricate asymmetical MESFETs.

It would also be desirable to fabricate asymmetrical and symmetrical devices on the same substrate to meet the needs of different applications. For example, a MESFET used for digital applications only requires a low breakdown voltage. However, a digital MESFET requires a high transconductance. Transconductance is dependent on the channel length of the device, or the distance between the $N^+$ source/drain regions. Analog applications also require MESFETs with high breakdown voltages and high transconductance. It would be desirable to form a variety of devices for use in power, analog, and digital applications which are all integrated in one chip. Thus, it would be desirable to form MESFETs having varying channel lengths and varying spacing between the drain region and the gate electrode. Of course, it is desirable that this process produce state-of-the-art devices at a low cost.

SUMMARY OF THE INVENTION

A method of fabricating a MESFET is comprised of providing a semiconductor material having a channel region formed therein, forming a gate on the semiconductor material over the channel region, forming a spacer adjacent a first portion of the gate disposed on the semiconductor material, and forming a hard mask disposed on a second portion of the gate and on a portion of the semiconductor material.

DETAILED DESCRIPTION OF THE PREFERRED EMBODIMENT

Figure 1:
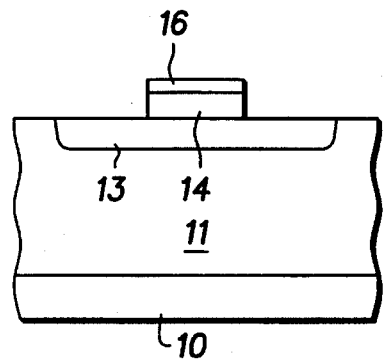
FIGS. 1–3 illustrate enlarged, cross-sectional views of a first embodiment of the present invention in different stages of fabrication.

FIG. 1 illustrates an enlarged, cross-sectional view of an embodiment of the present invention in a beginning stage of fabrication. What is shown in FIG. 1 is a semiconductor material 10 in which a channel region 13 is formed. Semiconductor material 10 is preferably comprised of undoped gallium arsenide. There are many known techniques for providing a channel region 13 in a semiconductor material 10. FIG. 1 only shows one of those techniques. First, a P-type region 11 is formed by selective ion implantation of suitable dopants in semiconductor material 10. Then, an N-type channel region 13 is formed inside P-type region 11 by ion implantation of suitable dopants, such as silicon. P-type region 11 is used to enhance the characteristics of channel region 13, thus channel region 13 can be formed without P-type region 11. Another way to form a channel region is by epitaxial layer growth on substrate 10, followed by electrical isolation of the intended device area.

After channel region 13 is formed, a refractory metal is deposited over the surface of semiconductor material 10. A hard mask 16 may be subsequently formed and patterned over the refractory metal. The refractory metal is then etched to form a gate 14. The refractory metal may be patterned without the use of hard mask 16, but with the use of a photoresist layer. The refractory metal of gate 14 is preferably comprised of titanium tungsten, titanium tungsten nitride, tungsten nitride, or tungsten silicide, however, other metallizations may be used which do not react with semiconductor material 10 upon being subjected to a heat treatment. It is desirable to make gate 14 thick in order to lower the resistance, however, if gate 14 is too thick, too much stress will be present. The thickness of gate 14 is preferably approximately 0.5 microns. If hard mask 16 is not used, the thickness of gate 14 must be thick enough to block out subsequent ion implantations performed later in the process. Hard mask 16 is preferably comprised of dielectric layers such as silicon dioxide, silicon nitride, silicon oxynitride, or a combination thereof.

Figure 2:
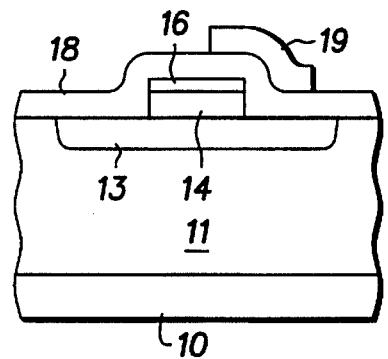

FIG. 2 illustrates the structure of FIG. 1 further along in processing. A conformal layer 18 is formed over the surface of substrate 10. Conformal layer 18 is preferably comprised of a dielectric layer such as silicon dioxide, silicon nitride, silicon oxynitride, or a combination thereof. It is preferable to use silicon nitride because it does not react with semiconductor material 10. Subsequently, a photoresist or masking layer 19 is formed and patterned over conformal layer 18 such that photoresist layer 19 is disposed over a portion of gate 14 and a portion of substrate 10.

Figure 3A:
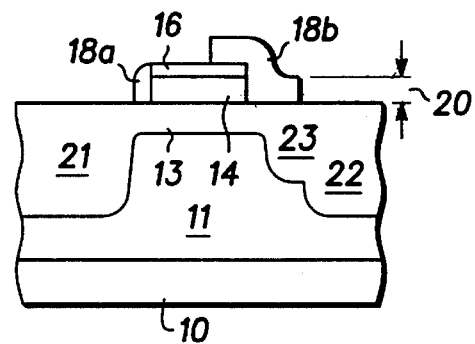
FIGS. 3A–3C illustrate enlarged, cross-sectional views of variations of the first embodiment.
Figure 3B:
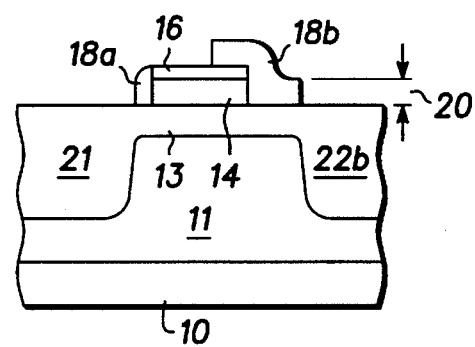
Figure 3:
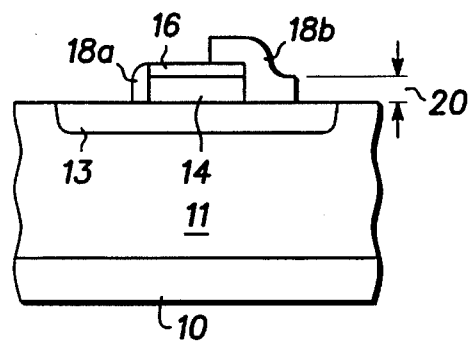

FIG. 3 illustrates the structure of FIG. 2 further along in processing. An etch is performed to remove portions of conformal layer 18 which are not masked by photoresist layer 19 or adjacent to gate 14 to form a spacer 18a adjacent to the unmasked portion of gate 14 and a hard mask 18b beneath photoresist layer 19. Hard mask 18b extends over a portion of gate 14 and over a portion of substrate 10. The thickness of a portion of hard mask 18b which is substantially horizontal to substrate 10, and disposed over substrate 10 is defined by a line 20. Photoresist layer 19 is subsequently removed. Forming a spacer by using an anisotropic etch is well known in the art.

FIG. 3A shows a first variation of the devices which may be formed. An N-type dopant is implanted into semiconductor material 10 to form source and drain regions. Spacer 18a prevents the penetration of dopants thereunder so that an N-type source region 21 is formed in semiconductor material 10 extending from spacer 18a away from gate 14. In this embodiment, the thickness of hard mask 18b, as shown by line 20, is approximately the same as the maximum penetration of the ion implantation so that an N+ drain region 22 is formed also having a shallower N+ region 23 formed under hard mask 18b. N+ drain region 22 extends away from gate 14.

FIG. 3B illustrates an alternate embodiment of that shown in FIG. 3A. Here, the thickness of hard mask 18b is much greater than the maximum penetration of the ion implantation so that only an N+ drain region 22 is formed in semiconductor material 10 where hard mask 18b is not disposed or extends from hard mask 18b away from gate 14.

Figure 3C:
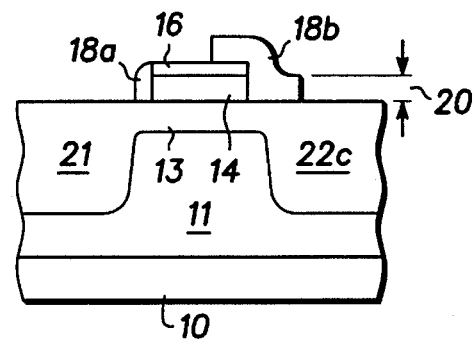

FIG. 3C illustrates another alternate embodiment of that shown in FIGS. 3A and 3B. Here the thickness of hard mask 18b is much less than the maximum penetration of the ion implantation so that an N+ drain region 22 is formed in semiconductor material 10 which extends underneath hard mask 18b. Each of the embodiments shown in FIGS. 3A–3C will have differing electrical characteristics which can be chosen to provide for analog, power, or digital applications.

Figure 4:
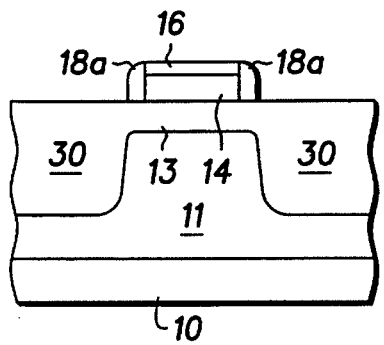
FIG. 4 illustrates an enlarged, cross-sectional view of a second embodiment of the present invention.

FIG. 4 illustrates a second embodiment of the present invention. FIG. 4 illustrates the structure of FIG. 2 further along in processing, but without the use of photoresist layer 19. After the formation of conformal layer 18, the anisotropic etch is performed to form spacers 18a adjacent to all sides of gate 14. An ion implantation is performed to form N+ source and drain regions 30. This device will exhibit low breakdown voltage and a very high transconductance. The fabrication of the device shown in FIG. 4 alone is well known in the art, however, in the present invention, it may be easily formed in conjunction with the other devices. In order to keep the manufacturing simple, it may be desirable to form only the devices of FIGS. 3A, 3B, or 3C and 4 on a single semiconductor material 10.

Figure 5:
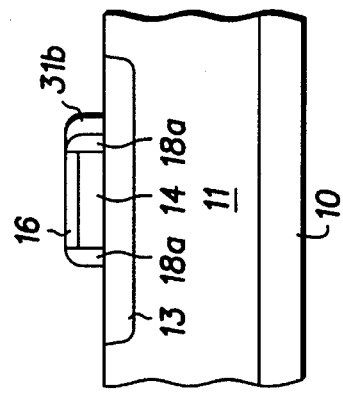
FIGS. 5 and 6 illustrate enlarged, cross-sectional views of a third embodiment of the present invention in different stages of fabrication.

FIG. 5 illustrates a structure as shown in FIG. 4, without forming source and drain regions 30, further processed to form alternate embodiments of the present invention. A second conformal layer 31 is formed on substrate 10. Conformal layer 31 can be comprised of the same material as conformal layer 18.

Figure 6:
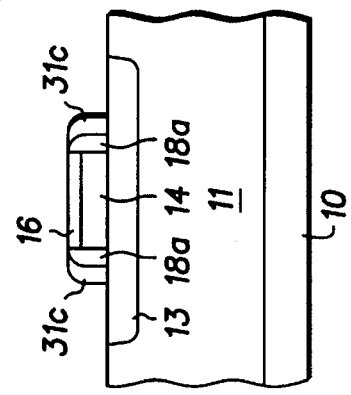

FIG. 6 illustrates a structure as shown in FIG. 5 further processed to form a third embodiment of the present invention. In this embodiment, a photoresist mask 32 is formed over a portion of gate 14 and over a portion of substrate 10. Conformal layer 31 is subsequently isotropically etched, to form a hard mask 31a where the photoresist mask 32 is disposed. Photoresist mask 32 is subsequently removed (not shown). Processing as described with reference to FIGS. 3A–3C may be performed to form substantially similar devices as those shown in FIGS. 3A–3C.

Figure 7:
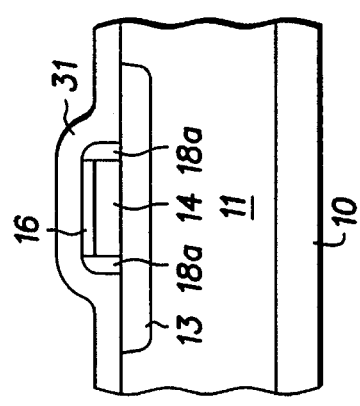
FIGS. 7 and 8 illustrate enlarged, cross-sectional views of a fourth and a fifth embodiment of the present invention.

FIG. 7 illustrates a structure as shown in FIG. 6 further processed to form a fourth embodiment of the present invention. When all of the devices shown in FIGS. 1–8 are processed on the same semiconductor material 10, the devices shown in FIGS. 3 and 6 will be masked before further processing. To form the structure of FIG. 7, an anisotropic etch on hard mask 31a is performed to form a spacer 31b adjacent to a portion of spacer 18a. N+ source and drain regions (not shown) may now be formed. This device will exhibit a medium gate-drain breakdown voltage and a high transconductance.

Figure 8:
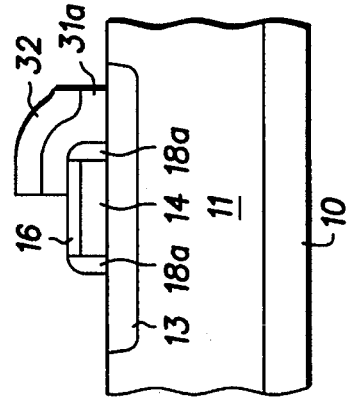
Figure 9:
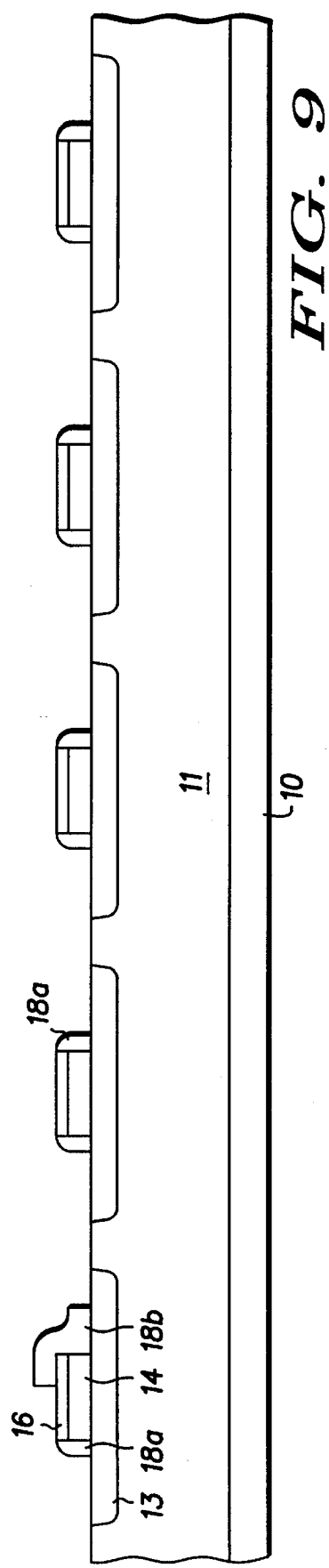
Figure 10:
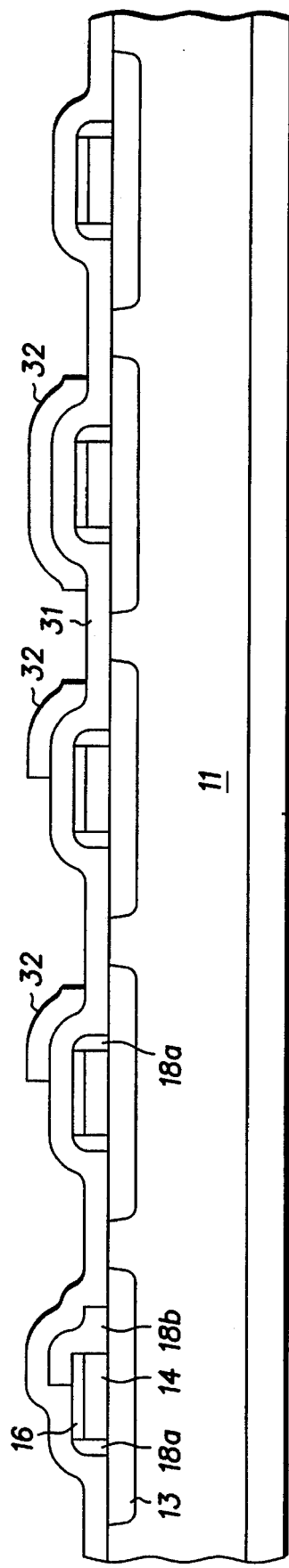
Figure 11:
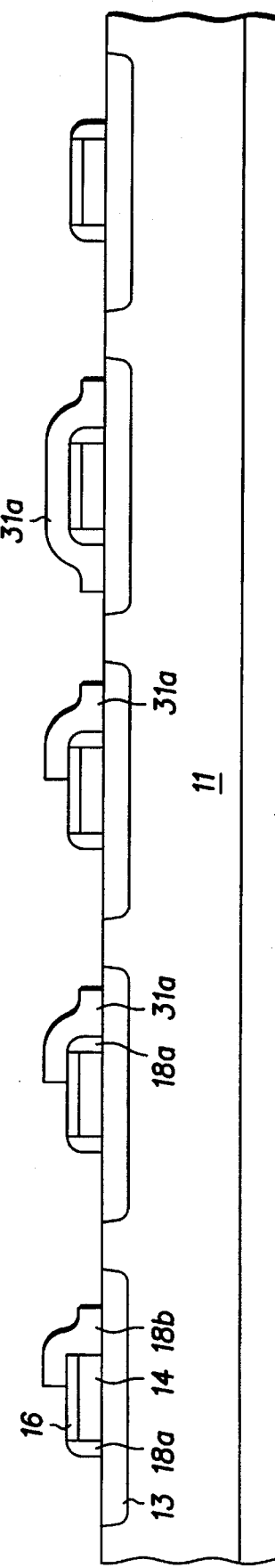
Figure 12:
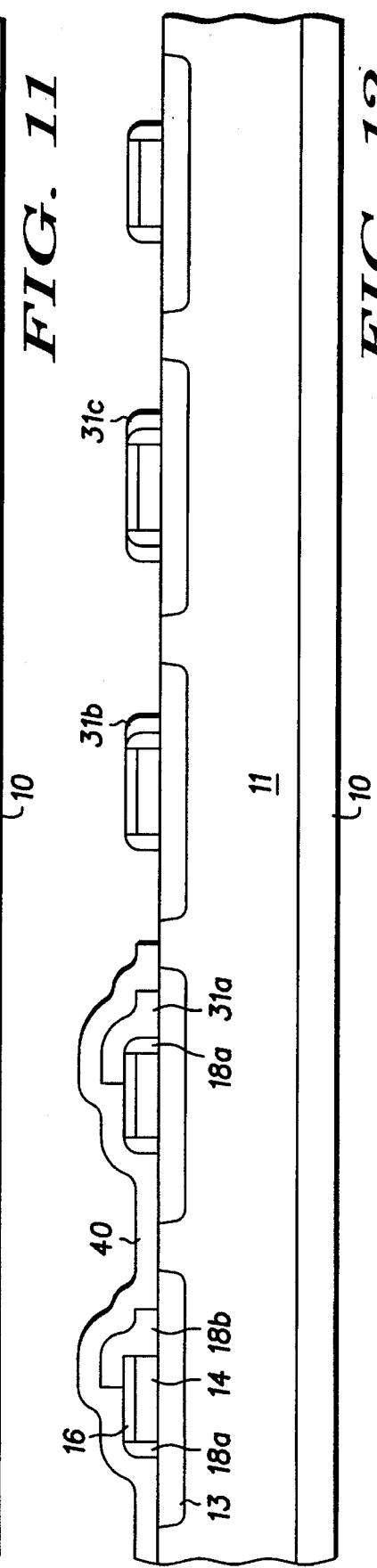

FIG. 8 illustrates a structure as shown in FIG. 5 further processed to form a fifth embodiment of the present invention. For the processing of the structure in FIG. 8, a photoresist layer is used to mask conformal layer 31 in the device region, so that during the isotropic etch used to fabricate the structure of FIG. 6, conformal layer 31 over the area of FIG. 8 is not etched. When all of the devices shown in FIGS. 1–8 are processed on the same semiconductor material 10, the devices shown in FIGS. 3 and 6 will be masked before further processing. In this embodiment, an anisotropic etch (the same etch as described in FIG. 7) is performed to form a spacer 31c adjacent to spacer 18a. N+ source and drain regions (not shown) may now be formed. In an integrated circuit, all source and drain regions will be formed at the same time. This device will produce a MESFET having a medium gate-drain breakdown voltage, a high source-drain breakdown voltage, and a medium transconductance. It may be desirable to form only the devices of FIGS. 6–8 alone or in combination with the structure of FIG. 4 on a single semiconductor material 10 to reduce the number of processing steps. If every device shown in FIGS. 3, 4, 6–8 is fabricated on the same substrate 10, at least a first, second, third, fourth, and a fifth gate would need to be fabricated on semiconductor material 10.

As can be readily seen, there has been provided a method of fabricating symmetrical and asymmetrical MESFETs on a single substrate in order to form integrated analog, digital, and power devices.

We claim:

1. A method of fabricating a semiconductor device comprising the steps of:

providing a semiconductor material, having a first channel region formed therein;

forming a first gate on the semiconductor material over only a portion of the first channel region;

forming a first conformal layer over the semiconductor material and over the first gate;

etching the first conformal layer to form a first spacer on the semiconductor material adjacent the first gate;

forming a second conformal layer on the semiconductor material, the first spacer and on the first gate;

providing a masking layer over the second conformal layer only over a first portion of the first gate and a first portion of the semiconductor material adjacent the first portion of the first gate;

etching the second conformal layer using the masking layer as a mask to form a hard mask only over the first portion of the first gate and the first portion of the semiconductor material adjacent the first portion of the first gate;

removing the masking layer and etching the hard mask to form a second spacer adjacent the first portion of the first gate; and forming a first source and a first drain region in a portion of the semiconductor material after removing the masking layer and etching the hard mask to form a second spacer.

2. A method of fabricating a semiconductor device comprising the steps of:

providing a semiconductor material, having a first channel region formed therein;

forming a first gate on the semiconductor material over only a portion of the first channel region;

forming a first conformal layer over the semiconductor material and over the first gate; etching the first conformal layer to form a first spacer adjacent the first gate disposed on the semiconductor material;

forming a second conformal layer over the semiconductor material, the first spacer and over the first gate;

etching the second conformal layer to form a first hard mask disposed only on a portion of the first gate, a portion of the first spacer and on a portion of the semiconductor material adjacent the portion of the first gate;

etching the first hard mask to form a second spacer disposed on the semiconductor material adjacent a portion of the first spacer; and forming a first source and a first drain region in a portion of the semiconductor material after etching the first hard mask to form a second spacer.

3. The method of claim 2 further comprising the steps of:

providing the semiconductor material having a second channel region formed therein;

forming a second gate on the semiconductor material over only a portion of the second channel region at the same time the first gate is formed;

forming a first spacer adjacent the second gate disposed on the semiconductor material at the same time the first spacer adjacent the first gate is formed; and forming a second source and a second drain region in a portion of the semiconductor material adjacent first spacer of the second gate after etching the first hard mask to form a second spacer and at the same time the first source and the first drain region are formed.

4. The method of claim 2 further comprising the steps of:

providing the semiconductor material having a second channel region formed therein;

forming a second gate on the semiconductor material over only a portion of the second channel region;

forming a second spacer adjacent the second gate disposed on the semiconductor material at the same time the first spacer and the first hard mask are formed;

forming a second hard mask disposed only on a first portion of the second gate and the second spacer and on a portion of the semiconductor material adjacent the first portion of the second gate and the second spacer; and forming a second source and a second drain region at the same time the first and the second source and drain regions are formed in a portion of the semiconductor material after the step of forming the second hard mask, wherein the second drain region is formed at least adjacent the second hard mask and partially overlapping the second channel region and the second source region is formed adjacent the second spacer and partially overlapping the second channel region.

5. The method of claim 4 further comprising the steps of:

providing the semiconductor material having a third channel region formed therein;

forming a third gate on the semiconductor material over only a portion of the third channel region;

forming a third spacer adjacent the third gate disposed on the semiconductor material at the same time the first spacer, the first hard mask, and the second spacer are formed;

forming a third hard mask disposed only on a first portion of the third gate and the third spacer and on a portion of the semiconductor material adjacent the first portion of the third gate and the third spacer at the same time the second hard mask is formed;

etching the third hard mask to form a fourth spacer adjacent the first portion of the third gate and on the portion of the semiconductor material adjacent the first portion of the third spacer; and forming a third source and a third drain region at the same time the first and the second source and drain regions are formed in a portion of the semiconductor material after the step of forming the fourth spacer, wherein the third drain region is formed adjacent the fourth spacer and partially overlapping the third channel region and the third source region is formed adjacent the third spacer and partially overlapping the third channel region.

6. The method of claim 5 further comprising the steps of:

providing the semiconductor material having a fourth channel region formed therein;

forming a fourth gate on the semiconductor material over only a portion of the fourth channel region;

forming a fifth spacer adjacent the fourth gate disposed on the semiconductor material at the same time the first spacer, the first hard mask, the second spacer, and the third spacer are formed;

forming a fourth hard mask disposed only on the fourth gate and the fifth spacer and on a portion of the semiconductor material adjacent the fourth gate and the fifth spacer at the same time the third hard mask is formed;

etching the fourth hard mask to form a sixth spacer adjacent the fourth gate and on the portion of the semiconductor material adjacent the fifth spacer at the same time the fourth spacer is formed; and forming a fourth source and a fourth drain region at the same time the first, the second, and the third source and drain regions are formed in a portion of the semiconductor material after the step of forming the sixth spacer, wherein the fourth drain region is formed adjacent the sixth spacer and partially overlapping the fourth channel region and the fourth source region is formed adjacent the fifth spacer and partially overlapping the fourth channel region.

7. The method of claim 6 further comprising the steps of:

providing the semiconductor material having a fifth channel region formed therein;

forming a fifth gate on the semiconductor material over only a portion of the fifth channel region;

forming a seventh spacer adjacent the fifth gate disposed on the semiconductor material at the same time the first spacer and the first hard mask are formed; and forming a fifth source and a fifth drain region, at the same time the first source and drain regions are formed, in a portion of the semiconductor material after the step of forming the seventh spacer, wherein the fifth drain region is formed adjacent a first portion of the seventh spacer and partially overlapping the fifth channel region and the fifth source region is formed adjacent a second portion the seventh spacer and partially overlapping the fifth channel region.

* * * * *